(12) United States Patent
Hu

(10) Patent No.: US 12,413,225 B2
(45) Date of Patent: Sep. 9, 2025

(54) CLAMPING CIRCUIT AND OFFSET OTA CIRCUIT THEREOF

(71) Applicant: Richtek Technology Corporation, Hsinchu (TW)

(72) Inventor: Min-Hung Hu, New Taipei (TW)

(73) Assignee: Richtek Technology Corporation, Hsinchu (TW)

( * ) Notice: Subject to any disclaimer, the term of this patent is extended or adjusted under 35 U.S.C. 154(b) by 10 days.

(21) Appl. No.: 18/655,330

(22) Filed: May 6, 2024

(65) Prior Publication Data
US 2025/0266821 A1  Aug. 21, 2025

(30) Foreign Application Priority Data
Feb. 21, 2024  (TW) .................... 113106218

(51) Int. Cl.
| | |
|---|---|
| *H03K 17/00* | (2006.01) |
| *H03F 3/45* | (2006.01) |
| *H03K 17/10* | (2006.01) |
| *H03K 17/16* | (2006.01) |

(52) U.S. Cl.
CPC ....... *H03K 17/102* (2013.01); *H03F 3/45273* (2013.01); *H03F 3/45475* (2013.01); *H03F 3/45982* (2013.01); *H03K 17/162* (2013.01); *H03F 2200/261* (2013.01)

(58) Field of Classification Search
CPC ................ H03K 17/102; H03K 17/162; H03F 3/45273; H03F 3/45475; H03F 3/45983; H03F 2200/261; G05F 1/10; G05F 1/46; G05F 1/461; G05F 1/56; G05F 1/561; G05F 1/571; G05F 1/573
See application file for complete search history.

(56) References Cited

U.S. PATENT DOCUMENTS

| | | | | |
|---|---|---|---|---|
| 7,589,507 | B2 * | 9/2009 | Mandal | ................... G05F 1/575 |
| | | | | 323/280 |
| 8,552,769 | B2 * | 10/2013 | Liang | ................... H03K 17/168 |
| | | | | 327/108 |
| 2003/0011422 | A1 * | 1/2003 | Bazes | ....................... G05F 1/56 |
| | | | | 327/540 |

(Continued)

FOREIGN PATENT DOCUMENTS

CN  111355225 A  6/2020

*Primary Examiner* — Tuan T Lam
(74) *Attorney, Agent, or Firm* — Huan-Yi Lin

(57) ABSTRACT

A clamping circuit for clamping its voltage difference between its first and second terminals includes: an offset operational trans-conductance amplification (OTA) circuit for generating an output current according to a differential mode voltage between its first and second terminals which have a common mode offset voltage; and an amplifier circuit for generating a first terminal voltage according to the output current of the offset OTA circuit, so as to clamp the voltage difference of the clamping circuit to not exceeding a clamping voltage level. The offset OTA circuit includes a first and a second offset OTA sub-circuits, which have common mode offset voltages, and an auxiliary offset circuit. The common mode offset voltage of the offset OTA circuit is equal to a sum of the common mode offset voltages of the first and the second offset OTA sub-circuit and an offset voltage of the auxiliary offset circuit.

22 Claims, 10 Drawing Sheets

(56) References Cited

U.S. PATENT DOCUMENTS

| | | | | |
|---|---|---|---|---|
| 2013/0082671 A1* | 4/2013 | Ivanov | .................... | G05F 1/563 |
| | | | | 323/281 |
| 2023/0359232 A1* | 11/2023 | Cheng | ................. | H03F 3/45273 |
| 2024/0372358 A1* | 11/2024 | Seebacher | .............. | H02H 9/046 |
| 2024/0405762 A1* | 12/2024 | Tomioka | .............. | H03K 17/102 |

* cited by examiner

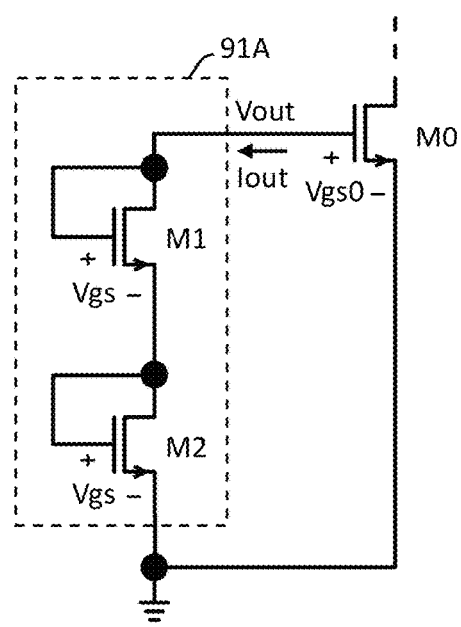
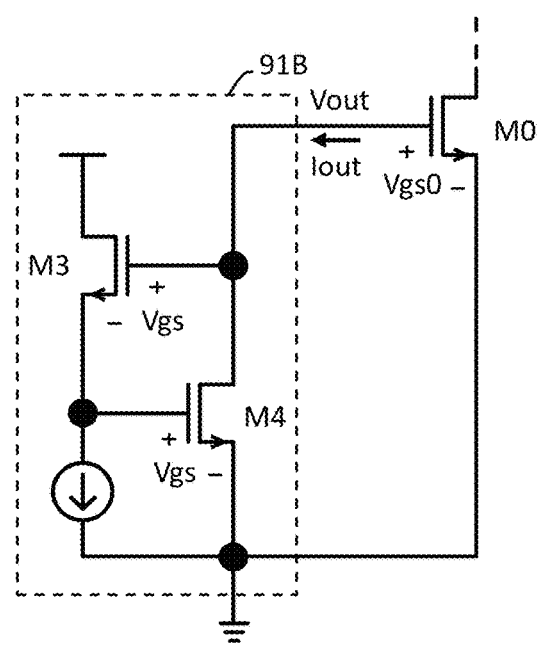
Fig. 1A (prior art)
Fig. 1B (prior art)
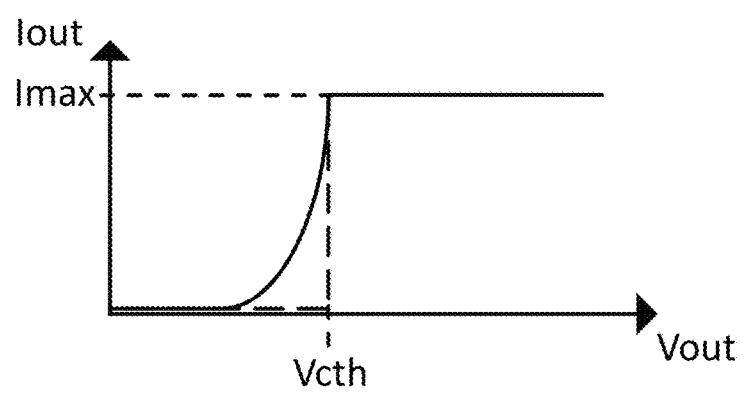
Fig. 1C (prior art)

CLAMPING CIRCUIT AND OFFSET OTA CIRCUIT THEREOF

CROSS REFERENCE

The present invention claims priority to TW patent application No. 113106218, filed on Feb. 21, 2024.

BACKGROUND OF THE INVENTION

Field of Invention

The present invention relates to a clamping circuit, particularly to a clamping circuit capable of precise clamping. The invention also relates to an offset operational trans-conductance amplification (OTA) circuit used within the clamping circuit.

Description of Related Art

FIG. 1A and FIG. 1B show schematic diagrams of clamping circuits from prior art. In the clamping circuit 91A of prior art shown in FIG. 1A, the gate-source voltage Vgs0 of the metal oxide semiconductor (MOS) transistor M0 is substantially clamped to twice the gate-source voltage Vgs of the diode-connected transistors M1 and M2, which are serially coupled, i.e., substantially clamped to twice the conduction threshold voltage of the MOS transistor. In the clamping circuit 91B of prior art shown in FIG. 1B, the gate of the MOS transistor M3 is coupled to the drain of MOS transistor M4, and its source is coupled to the gate of MOS transistor M4, thereby substantially clamping the gate-source voltage Vgs0 of the MOS transistor M0 to twice the gate-source voltage Vgs of the MOS transistor, i.e., substantially clamping to twice the conduction threshold voltage of the MOS transistor.

FIG. 1C shows the characteristic curve of clamping current and voltage for clamping circuits from prior art. As illustrated in FIG. 1C, when the gate-source voltage Vgs0 (i.e., the clamping voltage Vout) of the MOS transistor M0 exceeds the clamping threshold voltage Vcth, the clamping circuit 91A or 91B start to operate, clamping the gate-source voltage Vgs0 of the MOS transistor M0 at the clamping threshold voltage Vcth within a range limited by a maximum current Imax.

A drawback of the prior art, as shown in FIG. 1C, is that the clamping current Iout starts to increase before the clamping voltage Vout reaches the clamping threshold voltage Vcth, indicating that the prior art clamping circuits have leakage currents and poor gain, failing to achieve precise clamping (as indicated by the long dashed line in FIG. 1C).

Compared to the aforementioned prior art, the present invention provides a clamping circuit capable of precise clamping. Through the design of the offset operational trans-conductance amplification (OTA) circuit within the clamping circuit of the present invention, the characteristic curve of clamping current and voltage can be made to approach the ideal state, as indicated by the long dashed line in FIG. 1C, achieving precise clamping of the clamping circuit (e.g., the aforementioned MOS transistor M0). The clamping circuit of the present invention achieves advantages such as power saving, high efficiency, and high stability.

SUMMARY OF THE INVENTION

From one perspective, the present invention provides a clamping circuit for clamping a voltage difference between a first terminal and a second terminal of the clamping circuit so as not to exceed a clamping voltage level, comprising: an offset operational trans-conductance amplification (OTA) circuit configured to generate an output current at its output terminal according to a differential mode voltage between a first input terminal and a second input terminal, wherein a common mode offset voltage is present between the first input terminal and the second input terminal thereof, wherein the first input terminal and the second input terminal of the offset OTA circuit are respectively coupled to the first terminal and the second terminal of the clamping circuit; and an amplification stage circuit coupled between the output terminal and the first input terminal of the offset OTA circuit, configured to generate a first terminal voltage at the first terminal of the clamping circuit according to the output current of the offset OTA circuit, so as to clamp the voltage difference of the clamping circuit to not exceed the clamping voltage level; wherein the clamping voltage level corresponds to the common mode offset voltage of the offset OTA circuit; wherein the offset OTA circuit includes: a first offset OTA sub-circuit having a common mode offset voltage between its first input terminal and its second input terminal, configured to generate the output current of the offset OTA circuit at the output terminal of the offset OTA circuit based on a differential mode voltage between the first input terminal and the second input terminal thereof; a second offset OTA sub-circuit having a common mode offset voltage between its first input terminal and its second input terminal, configured to generate the output current of the offset OTA circuit at the output terminal of the offset OTA circuit based on a differential mode voltage between the first input terminal and the second input terminal thereof; and an auxiliary offset circuit configured to generate an auxiliary offset voltage between the first offset OTA sub-circuit and the second offset OTA sub-circuit; wherein plural input terminals of the first offset OTA sub-circuit, plural input terminals of the second offset OTA sub-circuit, and plural input terminals of the auxiliary offset circuit are connected in series, such that the common mode offset voltage of the offset OTA circuit equals a sum of the common mode offset voltage of the first offset OTA sub-circuit, the common mode offset voltage of the second offset OTA sub-circuit, and the auxiliary offset voltage.

In one preferred embodiment, the first offset OTA sub-circuit includes a follower amplification transistor, wherein an in-phase terminal, a control terminal, and an inverse-phase terminal of the follower amplification transistor respectively correspond to the first input terminal, the second input terminal, and the output terminal of the first offset OTA sub-circuit; wherein the common mode offset voltage of the first offset OTA sub-circuit is related to a conduction threshold voltage of the follower amplification transistor.

In one preferred embodiment, the amplification stage circuit includes a first amplification transistor, wherein a control terminal, an in-phase terminal, and an inverse-phase terminal of the first amplification transistor respectively correspond to the output terminal of the offset OTA circuit, a reference potential, and the first terminal of the clamping circuit.

In one preferred embodiment, the first amplification transistor and the follower amplification transistor are configured as a super follower circuit.

In one preferred embodiment, the common mode offset voltage of the first offset OTA sub-circuit and the auxiliary offset voltage have opposite voltage polarities, and the common mode offset voltage of the second offset OTA sub-circuit and the auxiliary offset voltage have opposite voltage polarities.

In one preferred embodiment, the auxiliary offset circuit includes an auxiliary offset transistor, wherein an inverse-phase terminal of the auxiliary offset transistor is electrically connected to its control terminal, wherein the auxiliary offset voltage is related to a conduction threshold voltage of the auxiliary offset transistor.

In one preferred embodiment, the auxiliary offset circuit further includes an auxiliary offset resistor serially connected with the auxiliary offset transistor, wherein the auxiliary offset resistor generates a portion of the auxiliary offset voltage based on an auxiliary offset current.

In one preferred embodiment, the second offset OTA sub-circuit includes a second amplification transistor, wherein a control terminal, an in-phase terminal, and an inverse-phase terminal of the second amplification transistor respectively correspond to the first input terminal and the second input terminal of the second offset OTA sub-circuit, and the output terminal of the offset OTA circuit.

In one preferred embodiment, the follower amplification transistor and the auxiliary offset transistor are first type of transistors, wherein the first amplification transistor and the second amplification transistor are second type of transistors, wherein an absolute value of a conduction threshold of the first type of transistors is less than an absolute value of a conduction threshold of the second type of transistors.

In one preferred embodiment, the offset OTA circuit further includes a bias transistor, wherein a control terminal thereof is coupled to the second amplification transistor; wherein the offset OTA circuit is configured as a common gate amplification circuit.

In one preferred embodiment, the second offset OTA sub-circuit includes a first differential transistor, a second differential transistor, and a common mode offset transistor; wherein an in-phase terminal and an inverse-phase terminal of the common mode offset transistor are respectively coupled to an in-phase terminal of the second differential transistor and an in-phase terminal of the first differential transistor, and a control terminal of the second differential transistor and a control terminal of the first differential transistor respectively correspond to the first input terminal and the second input terminal of the second offset OTA sub-circuit; wherein the first differential transistor and the second differential transistor are configured to differentially amplify the differential mode voltage between the first input terminal and the second input terminal of the second offset OTA sub-circuit, wherein the common mode offset voltage of the second offset OTA sub-circuit is related to a conduction threshold voltage of the common mode offset transistor.

In one preferred embodiment, the offset OTA circuit further includes a cascode transistor coupled between the inverse-phase terminal of the follower amplification transistor and the output terminal of the offset OTA circuit, wherein the cascode transistor is configured to bias the follower amplification transistor operating in a region with linear amplification characteristics.

From another perspective, the present invention provides an offset operational trans-conductance amplification (OTA) circuit for generating an output current at its output terminal based on a differential mode voltage between a first input terminal and a second input terminal thereof, wherein a common mode offset voltage is present between the first input terminal and the second input terminal thereof; the offset OTA circuit comprising: a first offset OTA sub-circuit having a common mode offset voltage between its first input terminal and its second input terminal, configured to generate the output current of the offset OTA circuit at the output terminal of the offset OTA circuit based on a differential mode voltage between the first input terminal and the second input terminal thereof; a second offset OTA sub-circuit having a common mode offset voltage between its first input terminal and its second input terminal, configured to generate the output current of the offset OTA circuit at the output terminal of the offset OTA circuit based on a differential mode voltage between the first input terminal and the second input terminal thereof; and an auxiliary offset circuit configured to generate an auxiliary offset voltage between the first offset OTA sub-circuit and the second offset OTA sub-circuit; wherein plural input terminals of the first offset OTA sub-circuit, plural input terminals of the second offset OTA sub-circuit, and plural input terminals of the auxiliary offset circuit are connected in series, such that the common mode offset voltage of the offset OTA circuit equals a sum of the common mode offset voltage of the first offset OTA sub-circuit, the common mode offset voltage of the second offset OTA sub-circuit, and the auxiliary offset voltage.

The objectives, technical details, features, and effects of the present invention will be better understood with regard to the detailed description of the embodiments below, with reference to the attached drawings.

BRIEF DESCRIPTION OF THE DRAWINGS

FIG. 1A and FIG. 1B show schematic diagrams of clamping circuits from prior art.

FIG. 1C shows the characteristic curve of clamping current related to voltage for clamping circuits from prior art.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 2A:
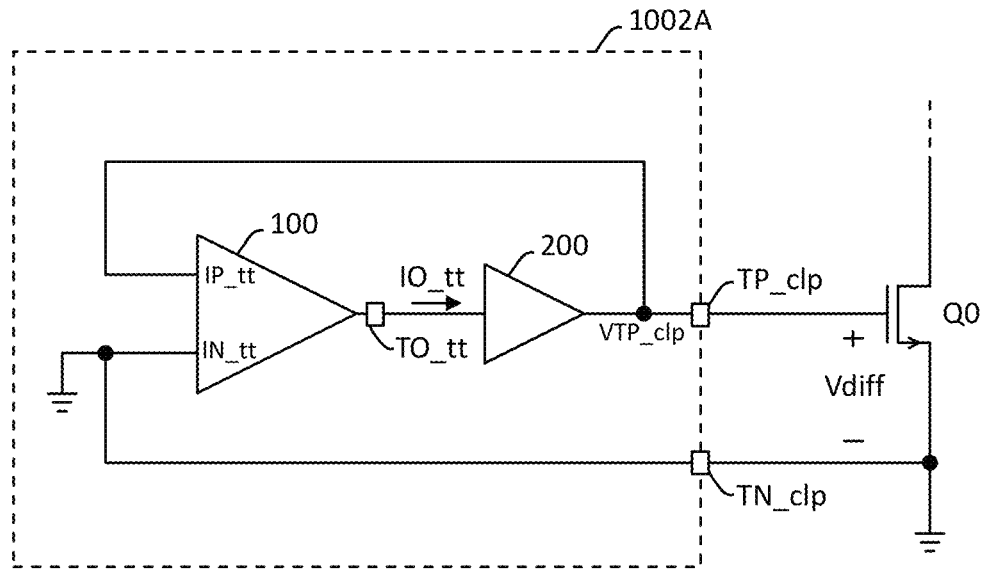
FIG. 2A and FIG. 2B show block diagrams of clamping circuits according to two embodiments of the present invention.
Figure 2B:
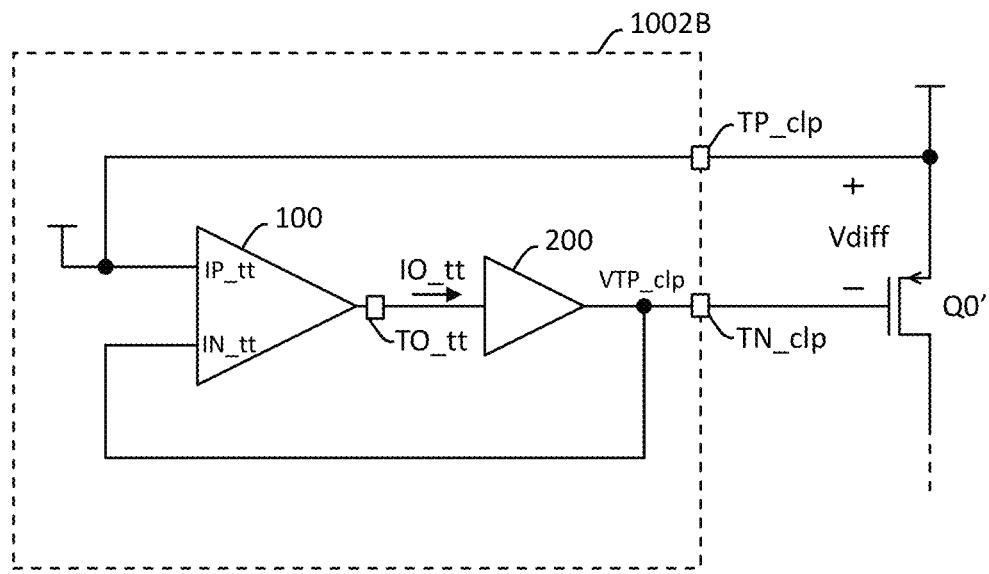

FIG. 2A and FIG. 2B show block diagrams of clamping circuits according to two embodiments of the present invention. In one embodiment, as shown in FIG. 2A, the clamping circuit 1002A is configured to clamp a voltage difference Vdiff between its first terminal TP_clp (e.g., the positive terminal) and its second terminal TN_clp (e.g., the negative terminal) so as not to exceed a clamping voltage level Vclp. In the embodiment of FIG. 2A, the first terminal TP_clp and the second terminal TN_clp of the clamping circuit 1002A are respectively coupled to the gate and the source of a transistor Q0, thereby clamping the gate-source voltage of the transistor Q0 not to exceed the clamping voltage level Vclp. The transistor Q0 is, for example, an N-type metal oxide semiconductor (MOS) transistor. In one embodiment, the clamping circuit 1002A includes: an offset operational trans-conductance amplification (OTA) circuit 100 and an amplification stage circuit 200.

In one embodiment, the offset OTA circuit 100 is configured to generate an output current IO_tt at its output terminal TO_tt according to a differential mode voltage between its first input terminal IP_tt and its second input terminal IN_tt. In this embodiment, a common mode offset voltage VOS_tt is present between the first input terminal IP_tt and the second input terminal IN_tt of the offset OTA circuit 100. The first input terminal IP_tt and the second input terminal IN_tt of the offset OTA circuit 100 are respectively coupled to the first terminal TP_clp and the second terminal TN_clp of the clamping circuit 1002A.

It should be noted that, in one embodiment, the first input terminal IP_tt of the offset OTA circuit 100 corresponds to its positive input terminal, and the second input terminal IN_tt corresponds to its negative input terminal. It should also be noted that the common mode offset voltage VOS_tt is the offset voltage inherent to the offset OTA circuit 100 itself. Therefore, the differential mode voltage between the first input terminal IP_tt and the second input terminal IN_tt of the offset OTA circuit 100 equals the voltage difference between the first input terminal IP_tt and the second input terminal IN_tt subtracting the common mode offset voltage VOS_tt.

In one embodiment, the amplification stage circuit 200 is coupled between the output terminal TO_tt and the first input terminal IP_tt of the offset OTA circuit 100. In one embodiment, the amplification stage circuit 200 is configured to generate a first terminal voltage VTP_clp at the first terminal TP_clp of the clamping circuit 1002A according to the output current IO_tt of the offset OTA circuit 100, in order to clamp the voltage difference Vdiff of the clamping circuit 1002A not to exceed the clamping voltage level Vclp. In one embodiment, the clamping voltage level Vclp corresponds to the common mode offset voltage VOS_tt of the offset OTA circuit 100.

In one embodiment, as shown in FIG. 2B, a first terminal TP_clp and a second terminal TN_clp of the clamping circuit 1002B are respectively coupled to the source and gate of a transistor Q0', thereby clamping the gate-source voltage of transistor Q0' at the clamping voltage level Vclp. The transistor Q0' is, for example, a P-type metal oxide semiconductor (MOS) transistor. The operational details of the clamping circuit 1002B can be inferred from the description of FIG. 2A and are not elaborated here. From FIG. 2A and FIG. 2B, it can be understood that the clamping circuit of the present invention can be used to clamp both NMOS and PMOS transistors. The following embodiments are described taking the clamping of NMOS transistor as examples, but this does not limit the scope of the present invention.

Figure 3:
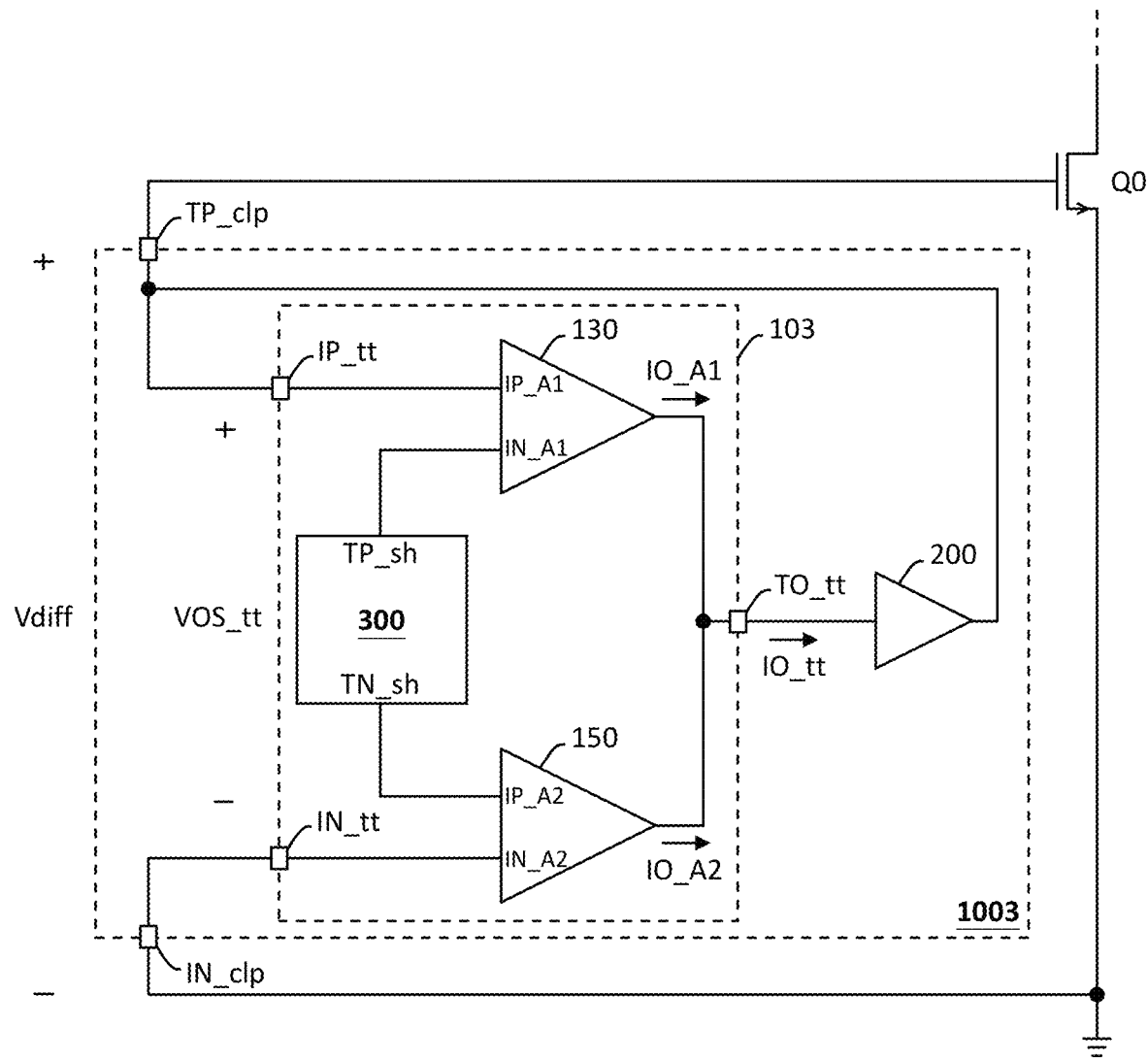
FIG. 3 shows a schematic diagram of a clamping circuit according to an embodiment of the present invention.

FIG. 3 shows a block diagram of a clamping circuit according to an embodiment of the present invention. In one embodiment, an offset OTA circuit 103 in the clamping circuit 1003 includes: a first offset OTA sub-circuit 130, a second offset OTA sub-circuit 150, and an auxiliary offset circuit 300. In one embodiment, the first offset OTA sub-circuit 130 has a common mode offset voltage VOS_A1 between its first input terminal IP_A1 and its second input terminal IN_A1. The first offset OTA sub-circuit 130 is configured to generate an output current IO_A1 according to the differential mode voltage between its first input terminal IP_A1 and its second input terminal IN_A1. In this embodiment, the first input terminal IP_A1 of the aforementioned first offset OTA sub-circuit 130 corresponds to its positive input terminal, and the second input terminal IN_A1 of the first offset OTA sub-circuit 130 corresponds to its negative input terminal, and the first input terminal IP_A1 of the first offset OTA sub-circuit 130 is coupled to the first input terminal IP_tt of the offset OTA circuit 103.

In one embodiment, as shown in FIG. 3, the second offset OTA sub-circuit 150 has a common mode offset voltage VOS_A2 between its first input terminal IP_A2 and its second input terminal IN_A2. The second offset OTA sub-circuit 150 is configured to generate an output current IO_A2 at its output terminal TO_tt based on a differential mode voltage between its first input terminal IP_A2 and its second input terminal IN_A2. In this embodiment, the first input terminal IP_A2 of the second offset OTA sub-circuit 150 corresponds to its positive input terminal, and the second input terminal IN_A2 corresponds to its negative input terminal. The second input terminal IN_A2 of the second offset OTA sub-circuit 150 is coupled to the second input terminal IN_tt of the offset OTA circuit 103. In this embodiment, the output terminal TO_tt of the offset OTA circuit 103 is configured to generate an output current IO_tt of the offset OTA circuit 103 based on the output currents IO_A1 and IO_A2. In one embodiment, the output current IO_tt of the offset OTA circuit 103 is a linear superposition of the output currents IO_A1 and IO_A2.

In one embodiment, the auxiliary offset circuit 300 is configured to generate an auxiliary offset voltage VOS_sh between the first offset OTA sub-circuit 130 and the second offset OTA sub-circuit 150. In one embodiment, the plural input terminals of the first offset OTA sub-circuit 130, the plural input terminals of the second offset OTA sub-circuit 150, and the plural input terminals of the auxiliary offset circuit 300 are interconnected in series. Specifically, in this embodiment, the second input terminal IN_A2 of the first offset OTA sub-circuit 130 and a first terminal TP_sh (e.g., the positive terminal) of the auxiliary offset circuit 300 are connected in series, and a second terminal TN_sh (e.g., the negative terminal) of the auxiliary offset circuit 300 and the first input terminal IP_A2 of the second offset OTA sub-circuit 150 are connected in series, such that, the common mode offset voltage VOS_tt of the offset OTA circuit 103 equals a sum of the common mode offset voltage VOS_A1 of the first offset OTA sub-circuit 130, the common mode offset voltage VOS_A2 of the second offset OTA sub-circuit 150, and the auxiliary offset voltage VOS_sh.

Figure 4:
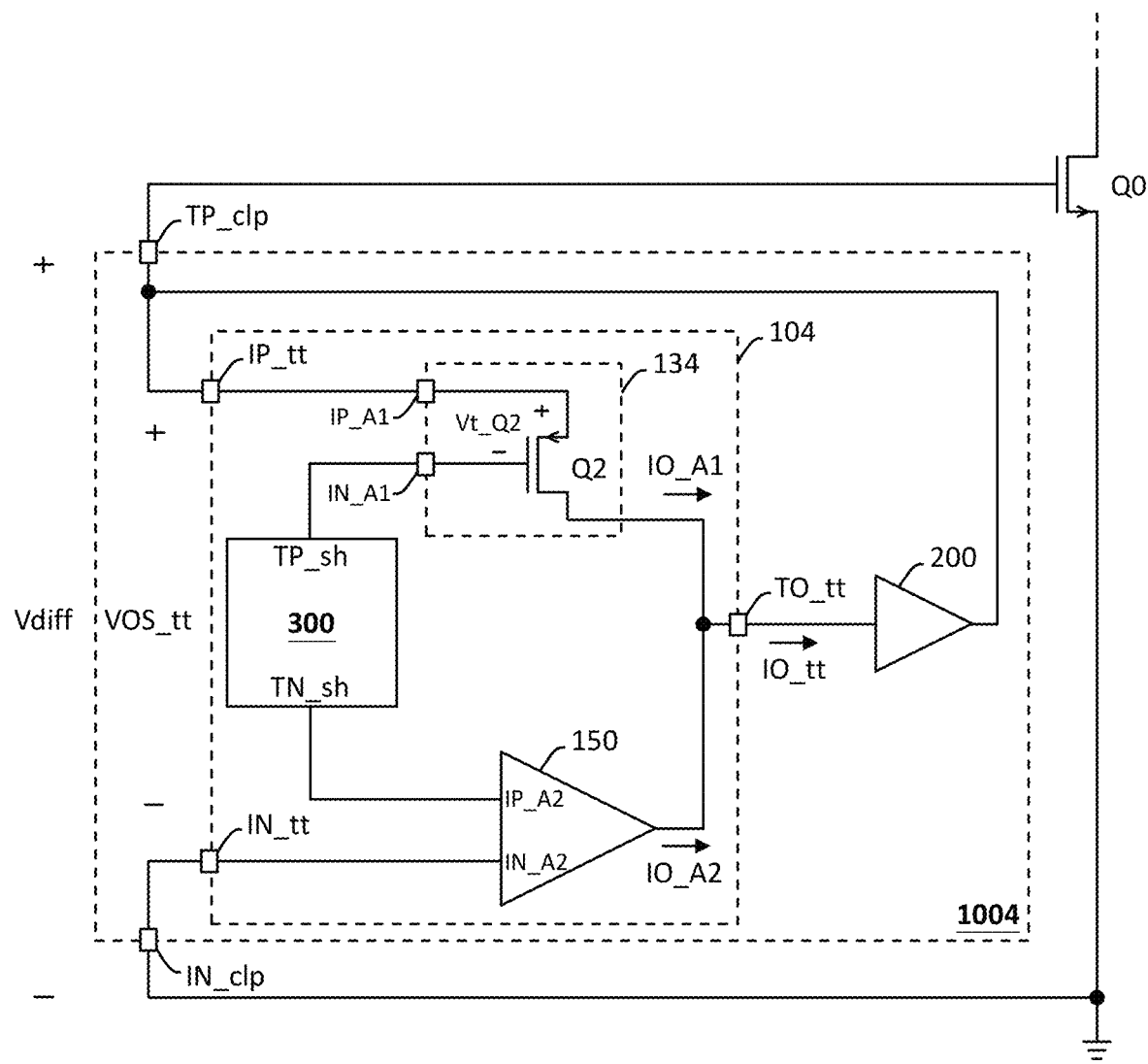
FIG. 4 shows a schematic diagram of a clamping circuit according to an embodiment of the present invention.

FIG. 4 shows a schematic diagram of a clamping circuit according to an embodiment of the present invention. An offset OTA circuit 104 of the clamping circuit 1004 in FIG. 4 corresponds to a specific embodiment of the offset OTA circuit 103 shown in FIG. 3. In one embodiment, a first offset OTA sub-circuit 134 in the offset OTA circuit 104 includes a follower amplification transistor Q2. In this embodiment, the follower amplification transistor Q2 is a PMOS transistor; however, this is not to limit the scope of the present invention, as in other embodiments, the follower amplification transistor Q2 could also be configured as a bipolar junction transistor (BJT), and the same applies to other transistors mentioned herein. In one embodiment, an in-phase terminal (source), a control terminal (gate), and an inverse-phase terminal (drain) of the follower amplification transistor Q2 respectively correspond to the first input terminal IP_A1 and the second input terminal IN_A1 of the first offset OTA sub-circuit 134, and the output terminal TO_tt of the offset OTA circuit 104. The common mode offset voltage VOS_A1 of the first offset OTA sub-circuit 134 is related to a conduction threshold voltage Vt_Q2 of the follower amplification transistor Q2, wherein in this embodiment, the common mode offset voltage VOS_A1 of the first offset OTA sub-circuit 134 equals the conduction threshold voltage Vt_Q2 of the follower amplification transistor Q2. In this embodiment, the follower amplification transistor Q2 is configured as a source follower.

Figure 5:
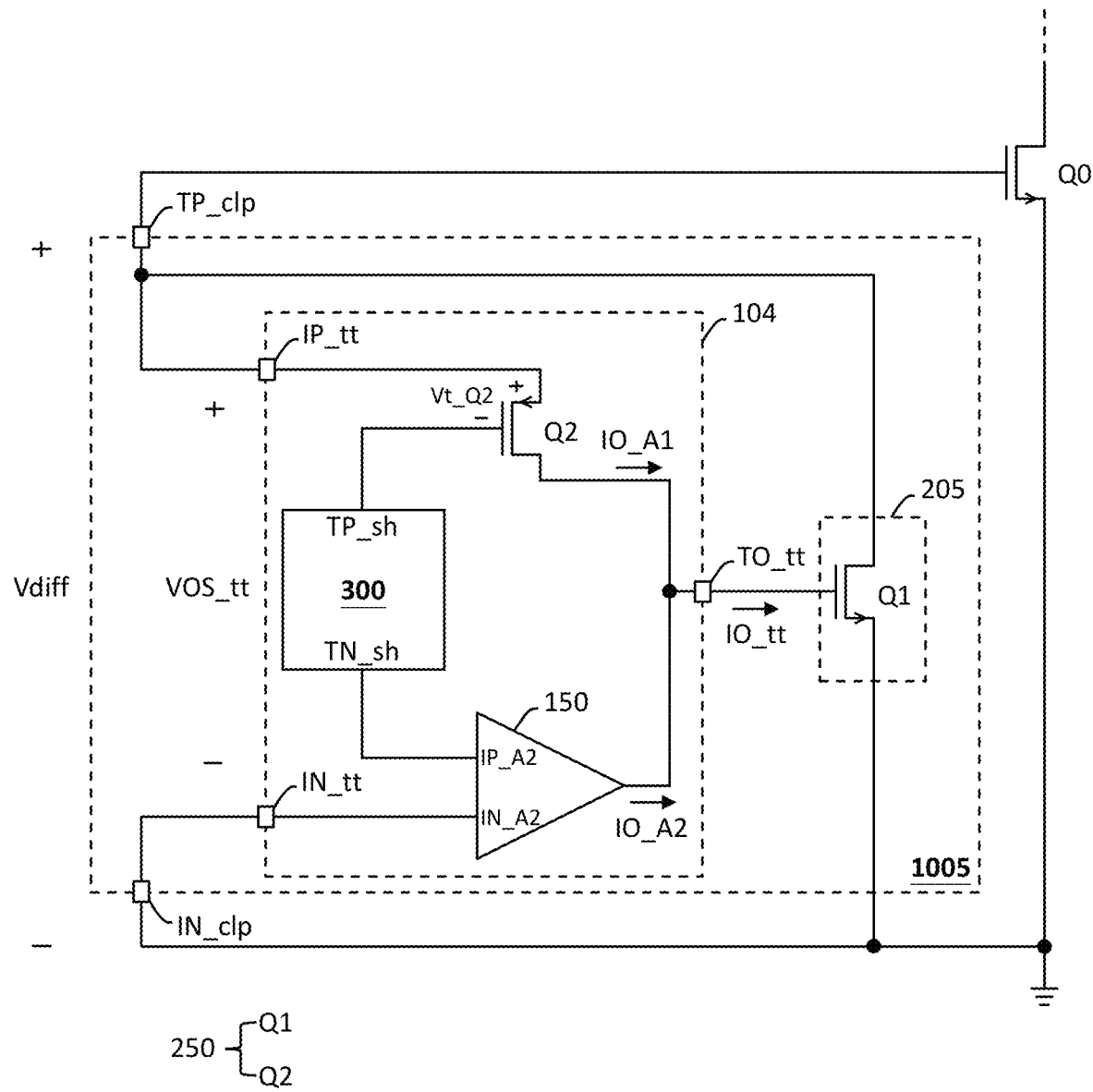
FIG. 5 shows a schematic diagram of a clamping circuit according to an embodiment of the present invention.

FIG. 5 shows a schematic diagram of a clamping circuit according to an embodiment of the present invention. The clamping circuit 1005 in FIG. 5 corresponds to a specific embodiment of the clamping circuit 1003 shown in FIG. 3. The clamping circuit 1005 is similar to the clamping circuit 1004 shown in FIG. 4, and in this embodiment, an amplification stage circuit 205 in the clamping circuit 1005 includes a first amplification transistor Q1. In this embodiment, the first amplification transistor Q1 is an NMOS transistor. A control terminal (gate), an in-phase terminal (source), and an inverse-phase terminal (drain) of the first amplification transistor Q1 respectively correspond to the output terminal TO_tt of the offset OTA circuit 104, a reference potential (in this embodiment, ground potential), and the first terminal TP_clp of the clamping circuit 1005. It should be noted that the aforementioned reference potential can be either a ground potential or a supply voltage potential.

In one embodiment, as shown in FIG. 5, the first amplification transistor Q1 and the follower amplification transistor Q2 are configured as a super follower circuit 250. In one embodiment, the super follower circuit is formed by amplifying the signal from the inverting terminal of the follower circuit through an inverting amplifier stage, and then feeding the amplified signal back to the non-inverting end of the follower circuit. Specifically, in the embodiment of FIG. 5, the signal at the inverse-phase terminal (drain) of the follower amplification transistor Q2 is amplified by the first amplification transistor Q1, and the amplified signal is then fed back to its in-phase terminal (source) of the follower amplification transistor Q2 to form the super follower circuit 250.

It should be noted that, by the configuration of the aforementioned super follower circuit 250, the follower effect of the follower amplification transistor Q2 is enhanced. That is, when the clamping circuit 1005 is activated, it can regulate the gate-source voltage of the follower amplification transistor Q2 closer to and approximately fixed at its conduction threshold voltage Vt_Q2. Thus, when the voltage difference Vdiff reaches the clamping voltage level Vclp, it is clamped close to but not exceeding the clamping voltage level Vclp, without leakage currents (as indicated by the ideal state shown by the long dashed line in FIG. 1C), thereby achieving precise clamping, power saving, high efficiency, and high stability. The various specific embodiments described in the following sections can also achieve the aforementioned effects.

Figure 6:
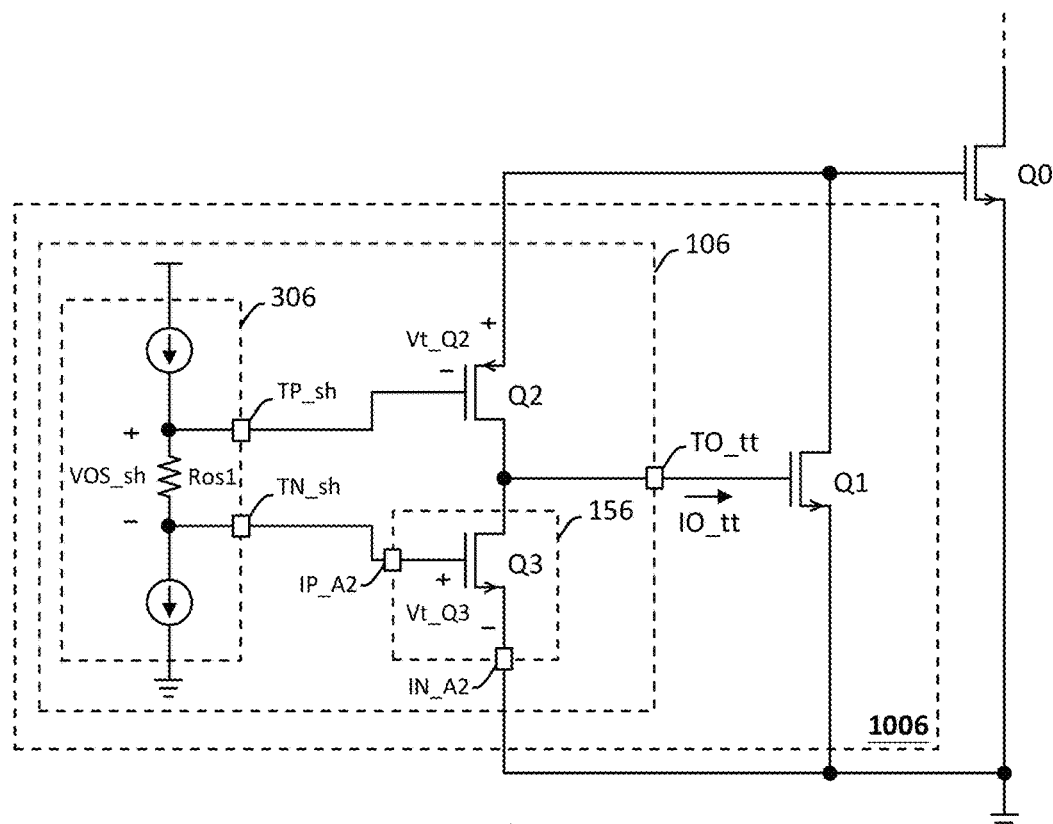
FIG. 6 shows a schematic diagram of a clamping circuit according to a specific embodiment of the present invention.

FIG. 6 shows a schematic diagram of a clamping circuit according to a specific embodiment of the present invention. The clamping circuit 1006 in FIG. 6 is similar to the clamping circuit 1005 in FIG. 5. Compared to the clamping circuit 1005 in FIG. 5, in one embodiment, within an offset OTA circuit 106, a second offset OTA sub-circuit 156 includes a second amplification transistor Q3. In one embodiment, an auxiliary offset circuit 306 includes plural current sources and a first offset resistor Ros1. The auxiliary offset voltage VOS_sh is the product of the current sources and the resistance value of the first offset resistor Ros1. In this embodiment, the second amplification transistor Q3 is an NMOS transistor, with its control terminal (gate), in-phase terminal (source), and inverse-phase terminal (drain) respectively corresponding to the first input terminal IP_A2 and the second input terminal IN_A2 of the second offset OTA sub-circuit 156, and the output terminal TO_tt of the offset OTA circuit 106.

From one perspective, FIG. 6 is a specific embodiment of FIG. 3. As shown in FIG. 6, the second input terminal IN_A1 (corresponding to the gate of the follower amplification transistor Q2) of the first offset OTA sub-circuit is serially connected with the first terminal TP_sh (corresponding to the positive terminal) of the auxiliary offset circuit 306, and the second terminal TN_sh (corresponding to the negative terminal) of the auxiliary offset circuit 306 is serially connected with the first input terminal IP_A2 (corresponding to the gate of the second amplification transistor Q3) of the second offset OTA sub-circuit 156. In the embodiment of FIG. 6, the gate-source voltage of the transistor Q0 is clamped to not exceed a sum of a conduction threshold voltage Vt_Q3 of the second amplification transistor Q3, the auxiliary offset voltage VOS_sh, and the conduction threshold voltage Vt_Q2 of the follower amplification transistor Q2, that is, in this embodiment, the clamping voltage level Vclp can be expressed by the following equation 1.

$$Vclp = Vt\_Q3 + VOS\_sh + Vt\_Q2 \qquad \text{(equation 1)}$$

Figure 7:
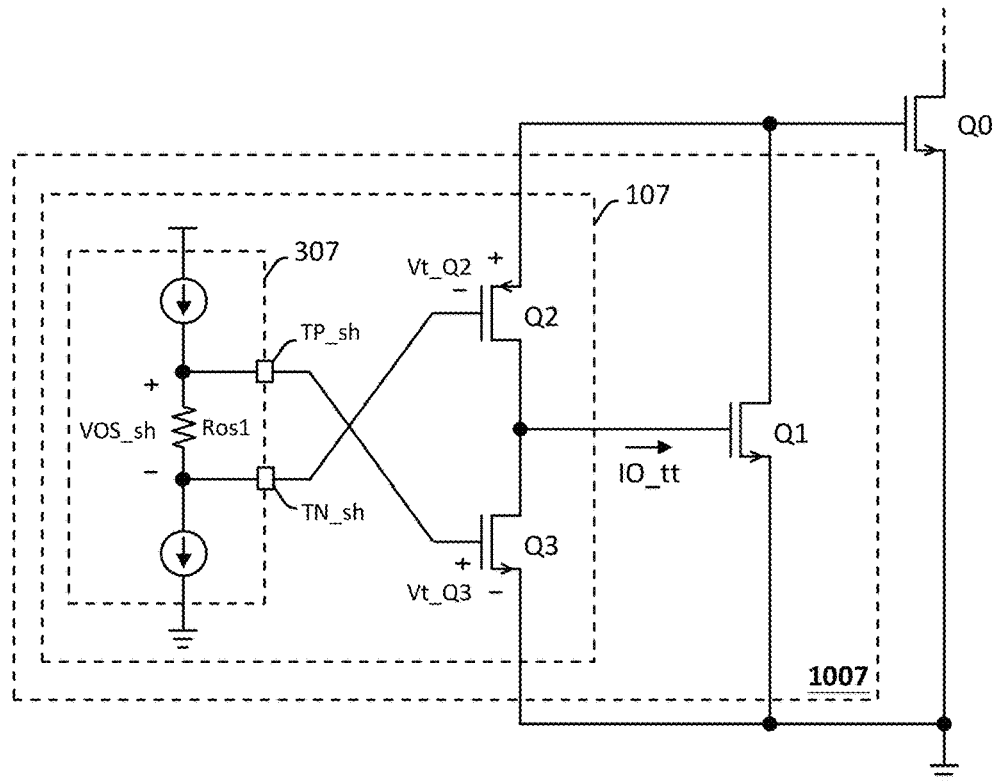
FIG. 7 shows a schematic diagram of a clamping circuit according to a specific embodiment of the present invention.

FIG. 7 shows a schematic diagram of a clamping circuit according to a specific embodiment of the present invention. The clamping circuit 1007 of FIG. 7 is similar to the clamping circuit 1006 of FIG. 6. Compared to the clamping circuit 1006 of FIG. 6, in one embodiment, within the offset OTA circuit 107, an auxiliary offset circuit 307 is connected in the opposite direction to the serial connection of the first and second offset OTA sub-circuits. Specifically, the gate of the follower amplification transistor Q2 is coupled to the second terminal TN_sh (corresponding to the negative terminal) of the auxiliary offset circuit 307, and the first terminal TP_sh (corresponding to the positive terminal) of the auxiliary offset circuit 307 is coupled to the gate of the second amplification transistor Q3.

In one embodiment, as shown in FIG. 7, the common mode offset voltage VOS_A1 (corresponding to the conduction threshold voltage Vt_Q2 of the follower amplification transistor Q2) of the first offset OTA sub-circuit and the auxiliary offset voltage VOS_sh have opposite voltage polarities. Besides, the common mode offset voltage VOS_A2 (corresponding to the conduction threshold voltage Vt_Q3 of the second amplification transistor Q3) of the second offset OTA sub-circuit and the auxiliary offset voltage VOS_sh have opposite voltage polarities. In this embodiment, the clamping voltage level Vclp can be expressed by the following equation 2.

$$Vclp = Vt\_Q3 + (-VOS\_sh) + Vt\_Q2 \quad \text{(equation 2)}$$

Figure 8:
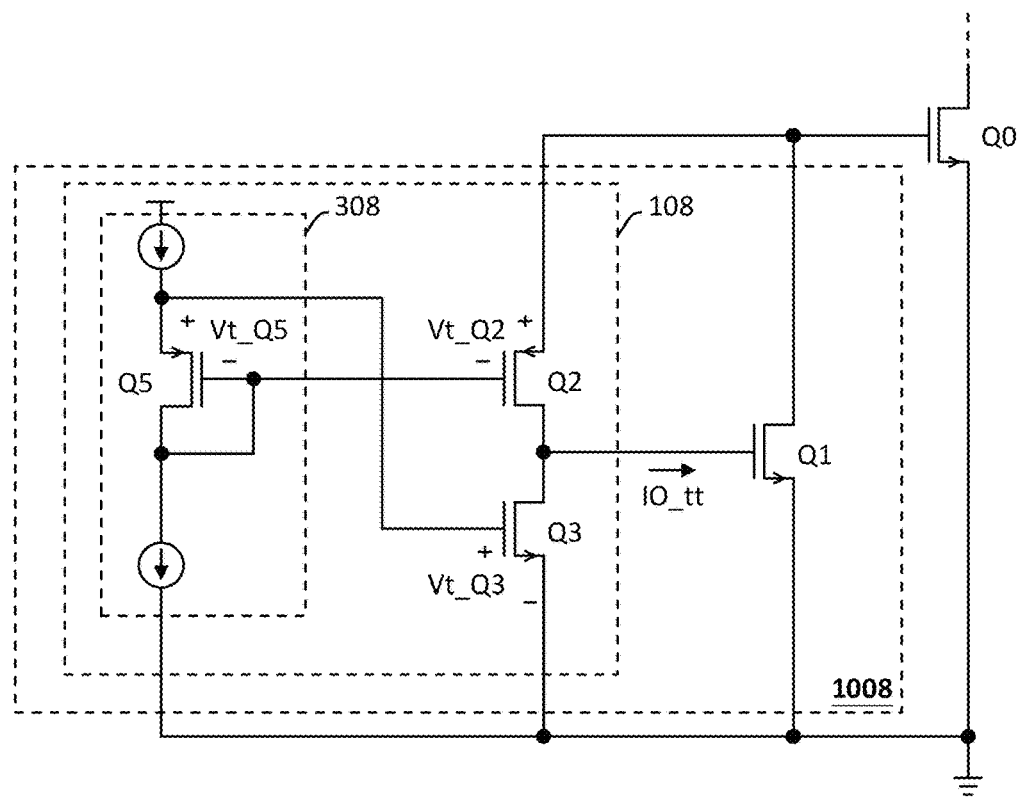
FIG. 8 shows a schematic diagram of an offset operational trans-conductance amplification (OTA) circuit in a clamping circuit according to a specific embodiment of the present invention.

FIG. 8 shows a schematic diagram of an offset operational trans-conductance amplification (OTA) circuit in a clamping circuit according to a specific embodiment of the present invention. The clamping circuit 1008 of FIG. 8 is similar to the clamping circuit 1007 of FIG. 7. Compared to the clamping circuit 1007 of FIG. 7, in this embodiment, as shown in an offset OTA circuit 108 of FIG. 8, the auxiliary offset circuit 308 includes an auxiliary offset transistor Q5. In one embodiment, the auxiliary offset transistor Q5 is a PMOS transistor, and its inverse-phase terminal (drain) is electrically connected to its control terminal (gate). The auxiliary offset voltage VOS_sh is related to the conduction threshold voltage Vt_Q5 of the auxiliary offset transistor Q5. In this embodiment, the auxiliary offset voltage VOS_sh equals to the conduction threshold voltage Vt_Q5 of the auxiliary offset transistor Q5.

It should be noted that in the embodiment shown in FIG. 8, the follower amplification transistor Q2 and the auxiliary offset transistor Q5 are first type of transistors (for example, PMOS transistors with low conduction threshold voltages), and the first amplification transistor Q1 and the second amplification transistor Q3 are second type of transistors (for example, NMOS transistors with standard conduction threshold voltages), wherein n the absolute value of the conduction threshold of the first type of transistors is less than that of the second type of transistors. Specifically, in this embodiment, the clamping voltage level Vclp can be expressed by the following equation 3.

$$Vclp = Vt\_Q3 + (-Vt\_Q5) + Vt\_Q2 \quad \text{(equation 3)}$$

From the above equation 3, it can be seen that the configuration of the conduction thresholds of the first type and second type transistors ensures that the current sources in the auxiliary offset circuit 308 remain conductive.

Figure 9:
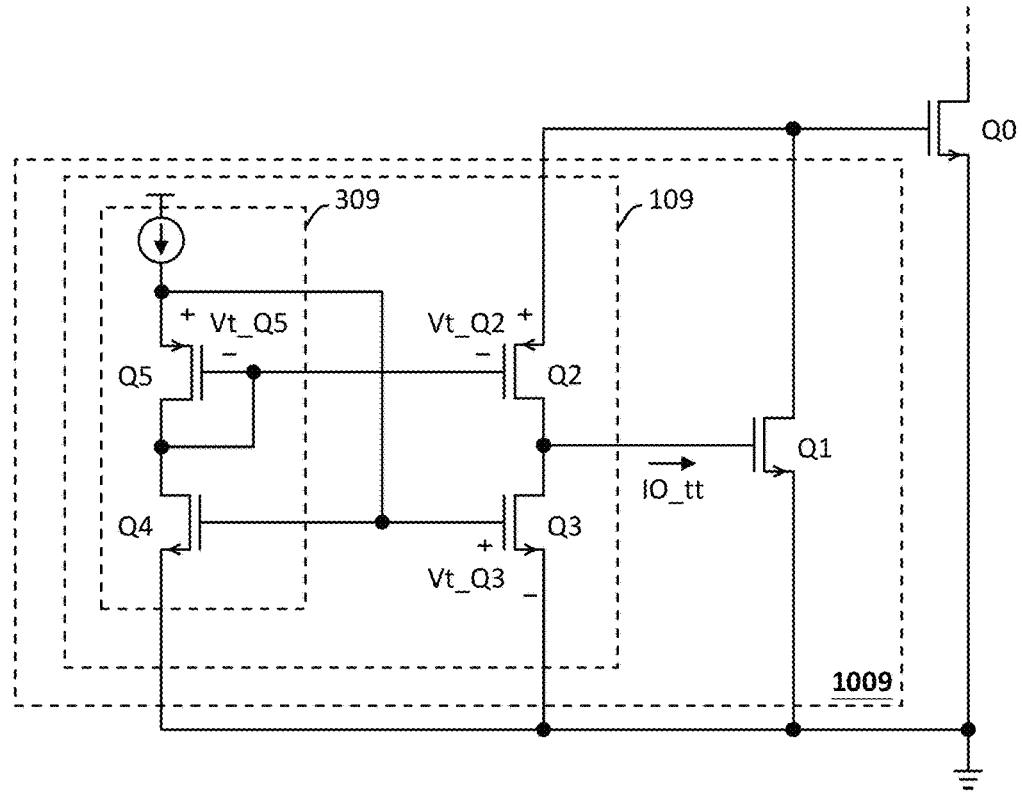
FIG. 9 shows a schematic diagram of an offset OTA circuit in a clamping circuit according to a specific embodiment of the present invention.

FIG. 9 shows a schematic diagram of an offset OTA circuit in a clamping circuit according to a specific embodiment of the present invention. The clamping circuit 1009 in FIG. 9 is similar to the clamping circuit 1008 in FIG. 8, and in this embodiment, as shown in FIG. 9, the auxiliary offset circuit 309 further includes a bias transistor Q4. In this embodiment, the bias transistor Q4 is an NMOS transistor, and its control terminal (gate) is coupled to the second amplification transistor Q3, thereby configuring the offset OTA circuit 109 as a common gate amplification circuit. In one embodiment, the common gate amplification circuit configured in the offset OTA circuit 109 is used to provide a reference voltage (namely the gate voltage of the follower amplification transistor Q2) for the super follower circuit 250 (including the first amplification transistor Q1 and the follower amplification transistor Q2).

Figure 10:
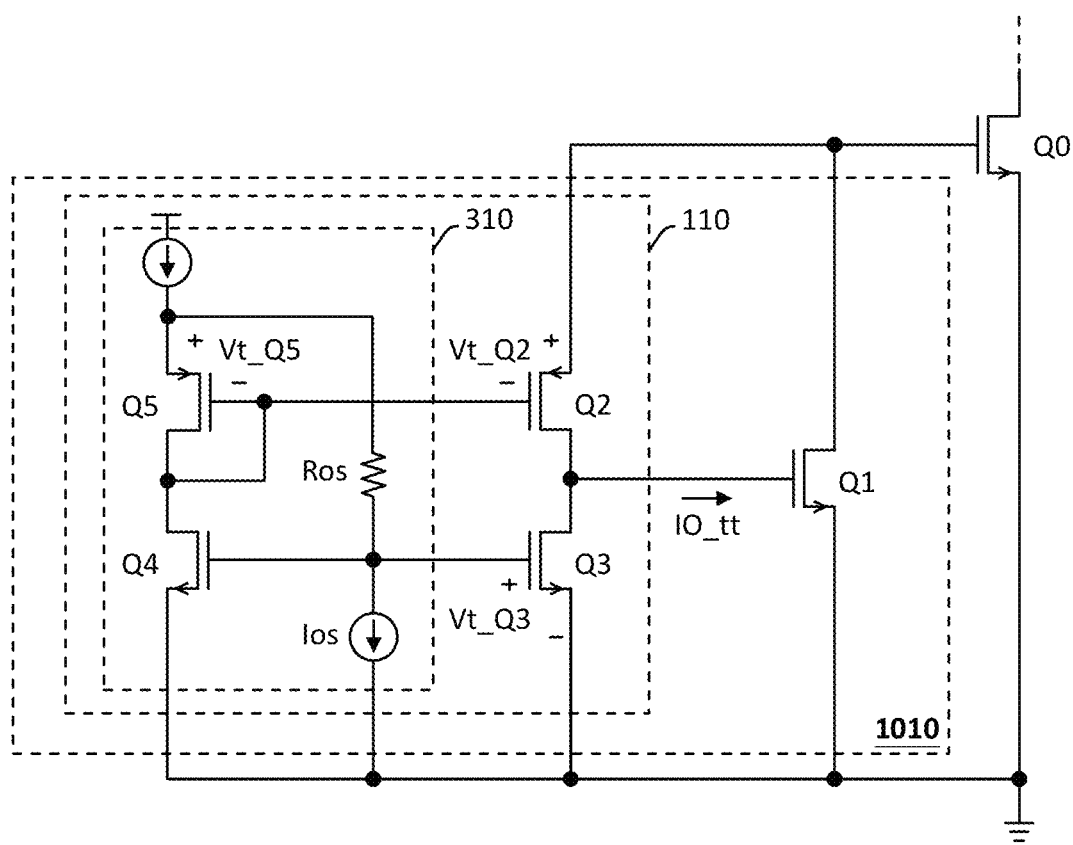
FIG. 10 shows a schematic diagram of an offset OTA circuit in a clamping circuit according to a specific embodiment of the present invention.

FIG. 10 shows a schematic diagram of an offset OTA circuit in a clamping circuit according to a specific embodiment of the present invention. The clamping circuit 1010 in FIG. 10 is similar to the clamping circuit 1009 in FIG. 9. Compared to the clamping circuit 1009 in FIG. 9, in this embodiment, within an offset OTA circuit 110 as shown in FIG. 10, the auxiliary offset circuit 310 further includes an auxiliary offset resistor Ros serially connected with the auxiliary offset transistor Q5. In one embodiment, the auxiliary offset resistor Ros generates a portion of the auxiliary offset voltage VOS_sh based on the auxiliary offset current Ios.

It should be noted that the embodiment shown in FIG. 10 is more cost-effective compared to the embodiment shown in FIG. 8. Specifically, in the embodiment shown in FIG. 10, the auxiliary offset resistor Ros is used to maintain the operation of the auxiliary offset circuit 310. In this embodiment, allowing the absolute values of the conduction thresholds of the follower amplification transistor Q2 and the auxiliary offset transistor Q5 to not be less than the absolute values of the conduction thresholds of the first amplification transistor Q1 and the second amplification transistor Q3, i.e., allowing the follower amplification transistor Q2 and the auxiliary offset transistor Q5 to be PMOS transistors with standard conduction threshold voltages, thereby reducing the fabrication costs of the follower amplification transistor Q2 and the auxiliary offset transistor Q5.

Figure 11:
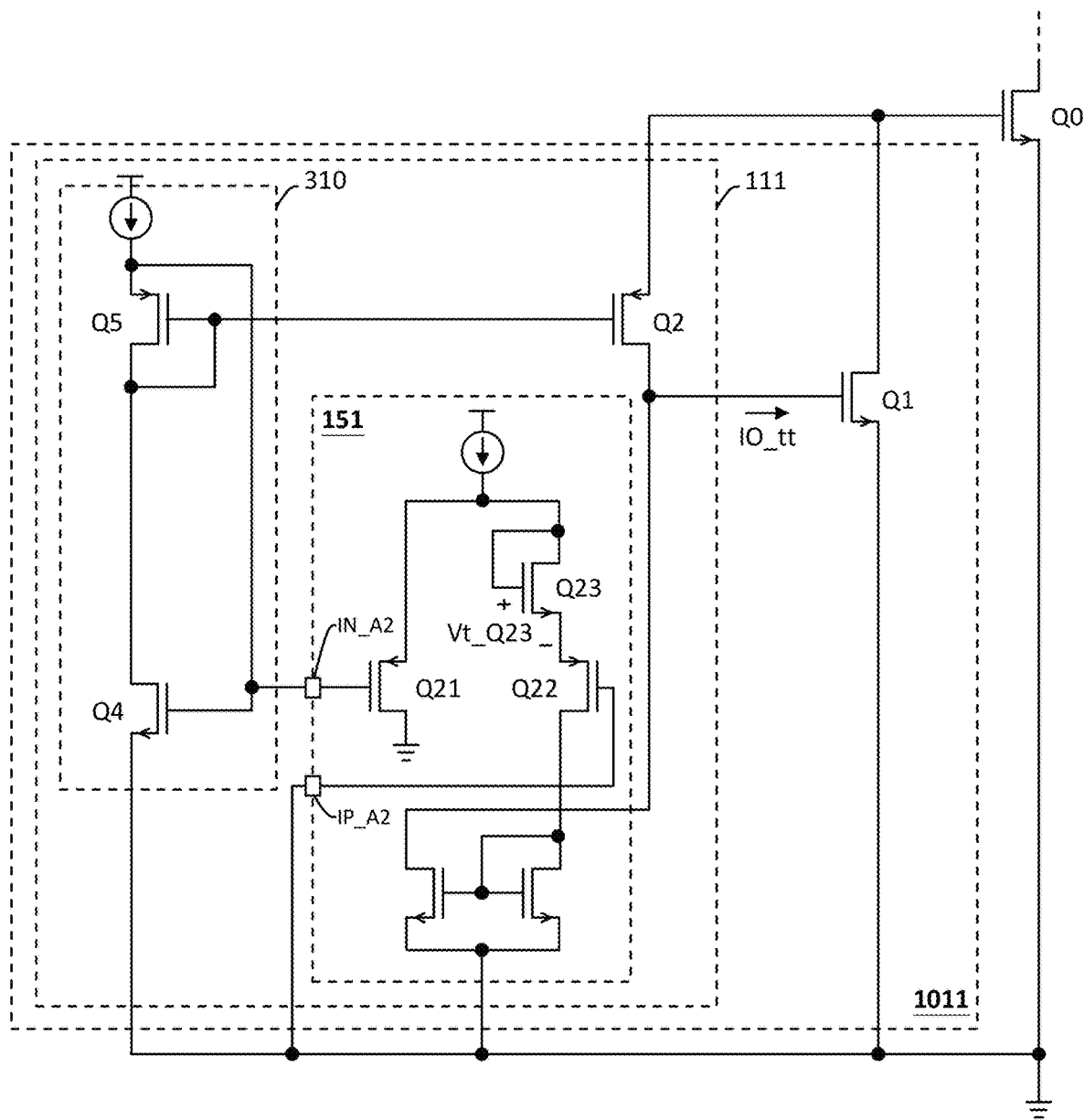
FIG. 11 shows a schematic diagram of a second offset OTA sub-circuit in a clamping circuit according to a specific embodiment of the present invention.

FIG. 11 shows a schematic diagram of a second offset OTA sub-circuit in a clamping circuit according to a specific embodiment of the present invention. The clamping circuit 1011 in FIG. 11 is similar to the clamping circuit 1009 in FIG. 9. Compared to the clamping circuit 1009 in FIG. 9, in one embodiment, a second offset OTA sub-circuit 151 in the offset OTA circuit 111 includes a first differential transistor Q21, a second differential transistor Q22, and a common mode offset transistor Q23. In this embodiment, the first differential transistor Q21 and the second differential transistor Q22 are PMOS transistors, and the common mode offset transistor Q23 is an NMOS transistor.

In one embodiment, as shown in FIG. 11, the common mode offset transistor Q23 is configured as a diode-connected transistor, i.e., its gate is electrically connected to its drain. An in-phase terminal (source) and an inverse-phase (drain) of the common mode offset transistor Q23 are respectively coupled to an in-phase terminal (source) of the second differential transistor Q22 and an in-phase terminal (source) of the first differential transistor Q21, and the control terminal (gate) of the second differential transistor Q22 and the control terminal (gate) of the first differential transistor Q21 respectively correspond to the first input terminal IP_A2 and the second input terminal IN_A2 of the second offset OTA sub-circuit 151. In one embodiment, the first differential transistor Q21 and the second differential transistor Q22 are used to differentially amplify the differential voltage between the first input terminal IP_A2 and the second input terminal IN_A2 of the second offset OTA sub-circuit 151. The common mode offset voltage VOS_A2 of the second offset OTA sub-circuit 151 is related to the conduction threshold voltage Vt_Q23 of the common mode offset transistor Q23.

It should be noted that in the embodiment shown in FIG. 11, since the first input terminal IP_A2 and the second input terminal IN_A2 of the second offset OTA sub-circuit 151 are both coupled to the gates of PMOS transistors, even if the common mode voltage between the first input terminal IP_A2 and the second input terminal IN_A2 of the second offset OTA sub-circuit 151 is low, the second offset OTA sub-circuit 151 can still operate. However, in the embodiment where the second offset OTA sub-circuit is configured as the second amplification transistor Q3, the voltage difference between the first input terminal IP_A2 and the second input terminal IN_A2 of the second offset OTA sub-circuit must be greater than the conduction threshold voltage Vt_Q3 of the second amplification transistor Q3 for the second offset OTA sub-circuit to activate, i.e., the common mode voltage at the first input terminal IP_A2 of the second offset OTA sub-circuit is limited. Therefore, the embodiment shown in FIG. 11 is more suitable for applications including low common mode input voltages compared to the previous embodiments.

Figure 12:
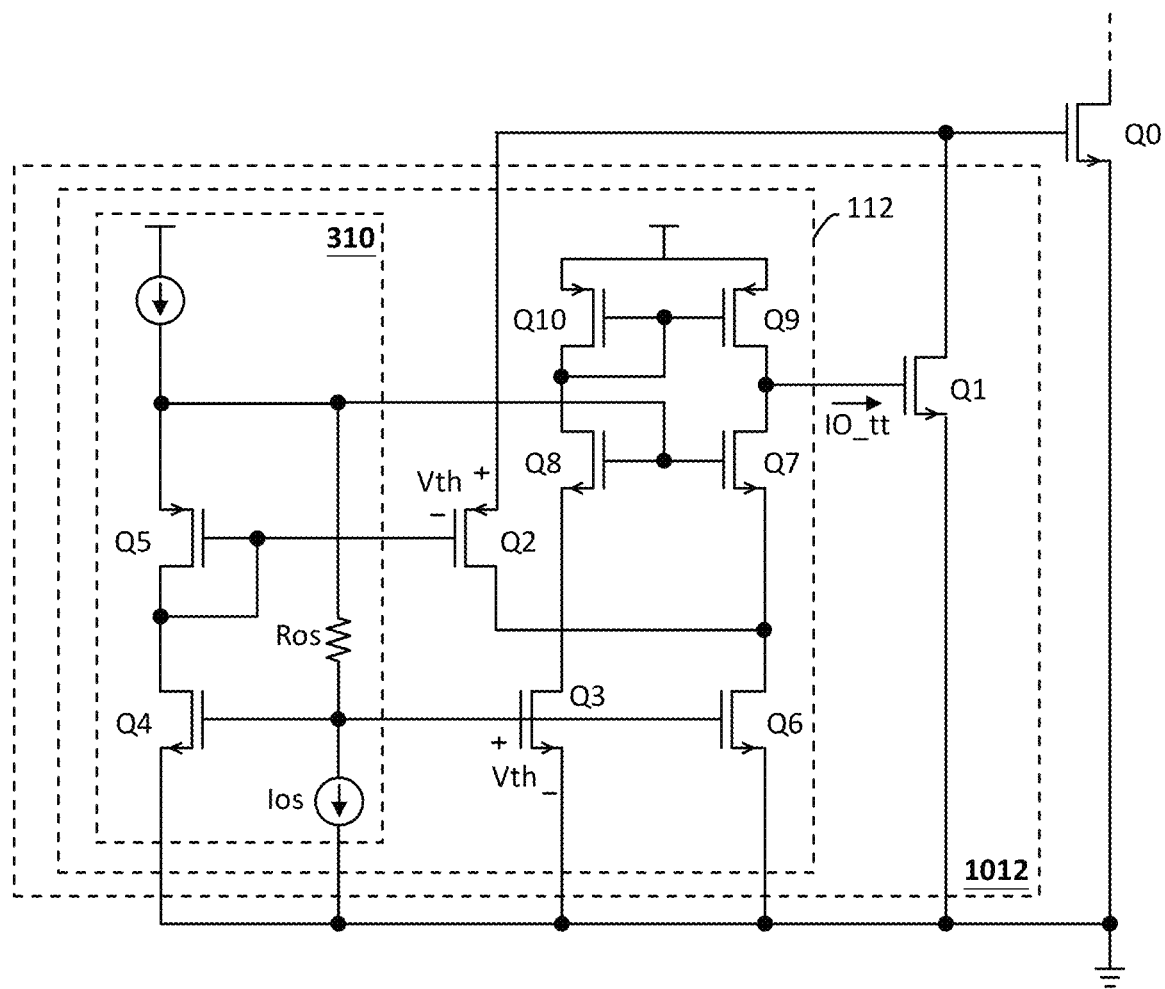
FIG. 12 shows a schematic diagram of an offset OTA circuit in a clamping circuit according to a specific embodiment of the present invention.

FIG. 12 shows a schematic diagram of an offset OTA circuit in a clamping circuit according to a specific embodiment of the present invention. The clamping circuit 1012 in FIG. 12 is similar to the clamping circuit 1010 in FIG. 10. Compared to the clamping circuit 1010 in FIG. 10, in this embodiment, an offset OTA circuit 112 of the clamping circuit 1012 further includes cascode transistors Q6~Q10. In one embodiment, the cascode transistor Q7 is coupled between the inverse-phase (drain) of the follower amplification transistor Q2 and the output terminal TO_tt of the offset OTA circuit 112, wherein the cascode transistor Q7 is configured to bias the follower amplification transistor Q2 operating in an operation region with characteristic of linear amplification, in this embodiment, to ensure that the follower amplification transistor Q2, as a MOS transistor, operates in the saturation region.

It should be noted that in the embodiment shown in FIG. 10, because the gate-source voltage of the transistor Q0 is close to the gate-source voltage of the first amplification transistor Q1, the drain-source voltage of the follower amplification transistor Q2 is lower, thereby possibly operating in the linear region of MOS transistor and resulting in a lower gain of the super follower circuit 250 (including the first amplification transistor Q1 and the follower amplification transistor Q2). In the embodiment shown in FIG. 12, by configuring the cascode transistors Q6~Q10, the drain-source voltage of the follower amplification transistor Q2 is increased, thereby ensuring that the follower amplification transistor Q2 operates in the saturation region of MOS transistor and enhancing the gain of the super follower circuit 250. Overall, the gain in the embodiment shown in FIG. 12 is superior to the previous embodiments, thus the clamping circuit 1012 in FIG. 12 achieves more precise clamping and other benefits.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A clamping circuit for clamping a voltage difference between a first terminal and a second terminal of the clamping circuit so as not to exceed a clamping voltage level, comprising:

an offset operational trans-conductance amplification (OTA) circuit configured to generate an output current at its output terminal according to a differential mode voltage between a first input terminal and a second input terminal, wherein a common mode offset voltage is present between the first input terminal and the second input terminal thereof, wherein the first input terminal and the second input terminal of the offset OTA circuit are respectively coupled to the first terminal and the second terminal of the clamping circuit; and an amplification stage circuit coupled between the output terminal and the first input terminal of the offset OTA circuit, configured to generate a first terminal voltage at the first terminal of the clamping circuit according to the output current of the offset OTA circuit, so as to clamp the voltage difference of the clamping circuit to not exceed the clamping voltage level;

wherein the clamping voltage level corresponds to the common mode offset voltage of the offset OTA circuit;

wherein the offset OTA circuit includes:

a first offset OTA sub-circuit having a common mode offset voltage between its first input terminal and its second input terminal, configured to generate the output current of the offset OTA circuit at the output terminal of the offset OTA circuit based on a differential mode voltage between the first input terminal and the second input terminal thereof;

a second offset OTA sub-circuit having a common mode offset voltage between its first input terminal and its second input terminal, configured to generate the output current of the offset OTA circuit at the output terminal of the offset OTA circuit based on a differential mode voltage between the first input terminal and the second input terminal thereof; and an auxiliary offset circuit configured to generate an auxiliary offset voltage between the first offset OTA sub-circuit and the second offset OTA sub-circuit;

wherein plural input terminals of the first offset OTA sub-circuit, plural input terminals of the second offset OTA sub-circuit, and plural input terminals of the auxiliary offset circuit are connected in series, such that the common mode offset voltage of the offset OTA circuit equals a sum of the common mode offset voltage of the first offset OTA sub-circuit, the common mode offset voltage of the second offset OTA sub-circuit, and the auxiliary offset voltage.

2. The clamping circuit of claim 1, wherein the first offset OTA sub-circuit includes a follower amplification transistor, wherein an in-phase terminal, a control terminal, and an inverse-phase terminal of the follower amplification transistor respectively correspond to the first input terminal, the second input terminal, and the output terminal of the first offset OTA sub-circuit;

wherein the common mode offset voltage of the first offset OTA sub-circuit is related to a conduction threshold voltage of the follower amplification transistor.

3. The clamping circuit of claim 2, wherein the amplification stage circuit includes a first amplification transistor, wherein a control terminal, an in-phase terminal, and an inverse-phase terminal of the first amplification transistor respectively correspond to the output terminal of the offset OTA circuit, a reference potential, and the first terminal of the clamping circuit.

4. The clamping circuit of claim 3, wherein the first amplification transistor and the follower amplification transistor are configured as a super follower circuit.

5. The clamping circuit of claim 3, wherein the common mode offset voltage of the first offset OTA sub-circuit and the auxiliary offset voltage have opposite voltage polarities, and the common mode offset voltage of the second offset OTA sub-circuit and the auxiliary offset voltage have opposite voltage polarities.

6. The clamping circuit of claim 3, wherein the auxiliary offset circuit includes an auxiliary offset transistor, wherein an inverse-phase terminal of the auxiliary offset transistor is electrically connected to its control terminal, wherein the auxiliary offset voltage is related to a conduction threshold voltage of the auxiliary offset transistor.

7. The clamping circuit of claim 6, wherein the auxiliary offset circuit further includes an auxiliary offset resistor serially connected with the auxiliary offset transistor, wherein the auxiliary offset resistor generates a portion of the auxiliary offset voltage based on an auxiliary offset current.

8. The clamping circuit of claim 6, wherein the second offset OTA sub-circuit includes a second amplification transistor, wherein a control terminal, an in-phase terminal, and an inverse-phase terminal of the second amplification transistor respectively correspond to the first input terminal and the second input terminal of the second offset OTA sub-circuit, and the output terminal of the offset OTA circuit.

9. The clamping circuit of claim 8, wherein the follower amplification transistor and the auxiliary offset transistor are first type of transistors, wherein the first amplification transistor and the second amplification transistor are second type of transistors, wherein an absolute value of a conduction threshold of the first type of transistors is less than an absolute value of a conduction threshold of the second type of transistors.

10. The clamping circuit of claim 8, wherein the offset OTA circuit further includes a bias transistor, wherein a control terminal thereof is coupled to the second amplification transistor; wherein the offset OTA circuit is configured as a common gate amplification circuit.

11. The clamping circuit of claim 6, wherein the second offset OTA sub-circuit includes a first differential transistor, a second differential transistor, and a common mode offset transistor;

wherein an in-phase terminal and an inverse-phase terminal of the common mode offset transistor are respectively coupled to an in-phase terminal of the second differential transistor and an in-phase terminal of the first differential transistor, and a control terminal of the second differential transistor and a control terminal of the first differential transistor respectively correspond to the first input terminal and the second input terminal of the second offset OTA sub-circuit;

wherein the first differential transistor and the second differential transistor are configured to differentially amplify the differential mode voltage between the first input terminal and the second input terminal of the second offset OTA sub-circuit, wherein the common mode offset voltage of the second offset OTA sub-circuit is related to a conduction threshold voltage of the common mode offset transistor.

12. The clamping circuit of claim 8, wherein the offset OTA circuit further includes a cascode transistor coupled between the inverse-phase terminal of the follower amplification transistor and the output terminal of the offset OTA circuit, wherein the cascode transistor is configured to bias the follower amplification transistor operating in a region with linear amplification characteristics.

13. An offset operational trans-conductance amplification (OTA) circuit for generating an output current at its output terminal based on a differential mode voltage between a first input terminal and a second input terminal thereof, wherein a common mode offset voltage is present between the first input terminal and the second input terminal thereof; the offset OTA circuit comprising:

a first offset OTA sub-circuit having a common mode offset voltage between its first input terminal and its second input terminal, configured to generate the output current of the offset OTA circuit at the output terminal of the offset OTA circuit based on a differential mode voltage between the first input terminal and the second input terminal thereof;

a second offset OTA sub-circuit having a common mode offset voltage between its first input terminal and its second input terminal, configured to generate the output current of the offset OTA circuit at the output terminal of the offset OTA circuit based on a differential mode voltage between the first input terminal and the second input terminal thereof; and an auxiliary offset circuit configured to generate an auxiliary offset voltage between the first offset OTA sub-circuit and the second offset OTA sub-circuit;

wherein plural input terminals of the first offset OTA sub-circuit, plural input terminals of the second offset OTA sub-circuit, and plural input terminals of the auxiliary offset circuit are connected in series, such that the common mode offset voltage of the offset OTA circuit equals a sum of the common mode offset voltage of the first offset OTA sub-circuit, the common mode offset voltage of the second offset OTA sub-circuit, and the auxiliary offset voltage.

14. The offset OTA circuit of claim 13, wherein the first offset OTA sub-circuit includes a follower amplification transistor, wherein an in-phase terminal, a control terminal, and an inverse-phase terminal of the follower amplification transistor respectively correspond to the first input terminal, the second input terminal, and the output terminal of the first offset OTA sub-circuit;

wherein the common mode offset voltage of the first offset OTA sub-circuit is related to a conduction threshold voltage of the follower amplification transistor.

15. The offset OTA circuit of claim 13, wherein the common mode offset voltage of the first offset OTA sub-circuit and the auxiliary offset voltage have opposite voltage polarities, and the common mode offset voltage of the second offset OTA sub-circuit and the auxiliary offset voltage have opposite voltage polarities.

16. The offset OTA circuit of claim 13, wherein the auxiliary offset circuit includes an auxiliary offset transistor, wherein an inverse-phase terminal of the auxiliary offset transistor is electrically connected to its control terminal; wherein the auxiliary offset voltage is related to a conduction threshold voltage of the auxiliary offset transistor.

17. The offset OTA circuit of claim 16, wherein the auxiliary offset circuit further includes an auxiliary offset resistor serially connected with the auxiliary offset transistor, wherein the auxiliary offset resistor generates a portion of the auxiliary offset voltage based on an auxiliary offset current.

18. The offset OTA circuit of claim 16, wherein the second offset OTA sub-circuit includes an amplification transistor, wherein a control terminal, an in-phase terminal, and an inverse-phase terminal of the amplification transistor respectively correspond to the first input terminal and the second input terminal of the second offset OTA sub-circuit, and the output terminal of the offset OTA circuit.

19. The offset OTA circuit of claim 18, wherein the follower amplification transistor and the auxiliary offset transistor are first type of transistors, wherein the amplification transistor are second type of transistors, wherein an absolute value of a conduction threshold of the first type of transistors is less than an absolute value of a conduction threshold of the second type of transistors.

20. The offset OTA circuit of claim 18, further comprising a bias transistor, wherein a control terminal thereof is coupled to the amplification transistor; wherein the offset OTA circuit is configured as a common gate amplification circuit.

21. The offset OTA circuit of claim 16, wherein the second offset OTA sub-circuit includes a first differential transistor, a second differential transistor, and a common mode offset transistor;

wherein an in-phase terminal and an inverse-phase terminal of the common mode offset transistor are respectively coupled to an in-phase terminal of the second differential transistor and an in-phase terminal of the first differential transistor, and a control terminal of the second differential transistor and a control terminal of the first differential transistor respectively correspond to the first input terminal and the second input terminal of the second offset OTA sub-circuit;

wherein the first differential transistor and the second differential transistor are configured to differentially amplify the differential mode voltage between the first input terminal and the second input terminal of the second offset OTA sub-circuit; wherein the common mode offset voltage of the second offset OTA sub-circuit is related to a conduction threshold voltage of the common mode offset transistor.

22. The offset OTA circuit of claim 18, further includes a cascode transistor, coupled between the inverse-phase terminal of the follower amplification transistor and the output terminal of the offset OTA circuit, wherein the cascode transistor is configured to bias the follower amplification transistor operating in a region with linear amplification characteristics.

* * * * *